(12) United States Patent
Udrea et al.

(10) Patent No.: US 10,593,826 B2
(45) Date of Patent: Mar. 17, 2020

(54) INFRA-RED DEVICES

(71) Applicant: Cambridge GaN Devices Limited, Cambourne (GB)

(72) Inventors: Florin Udrea, Cambridge (GB); Andrea De Luca, Cambridge (GB); Giorgia Longobardi, Cambridge (GB)

(73) Assignee: CAMBRIDGE GAN DEVICES LIMITED, Cambourne (GB)

( * ) Notice: Subject to any disclaimer, the term of this patent is extended or adjusted under 35 U.S.C. 154(b) by 0 days.

(21) Appl. No.: 15/938,425

(22) Filed: Mar. 28, 2018

(65) Prior Publication Data

US 2019/0305175 A1   Oct. 3, 2019

(51) Int. Cl.
*H01L 33/00* (2010.01)
*H05B 3/28* (2006.01)
(Continued)

(52) U.S. Cl.
CPC ...... *H01L 33/0025* (2013.01); *H01L 27/1443* (2013.01); *H01L 27/1446* (2013.01); *H01L 27/15* (2013.01); *H01L 27/16* (2013.01); *H01L 31/03044* (2013.01); *H01L 31/03048* (2013.01); *H01L 31/109* (2013.01); *H01L 31/112* (2013.01); *H01L 31/1848* (2013.01);
(Continued)

(58) Field of Classification Search
CPC ............. H01L 33/0025; H01L 33/0041; H01L 33/0075; H01L 33/32; H01L 27/1443; H01L 27/1446; H01L 27/15; H01L 27/16; H01L 31/03044; H01L 31/03048; H01L 31/109; H01L 31/112; H01L 31/1848; H01L 31/1856; H01L 35/22; H01L 35/30; H01L 35/34; H01L 29/778; H05B 3/28
See application file for complete search history.

(56) References Cited

U.S. PATENT DOCUMENTS 3,992,940 A    11/1976  Platzer, Jr.
5,285,131 A    2/1994   Muller
(Continued)

FOREIGN PATENT DOCUMENTS

EP    2056337           6/2009
WO    2002080620        10/2002
WO    2010151012 A      12/2010

OTHER PUBLICATIONS

Yoo et al., Fabrication, Characteristic and Application of a Microelectromechanical System (MEMS) Thermopile for Non-Dispersive Infrared Gas Sensors, Meas., Sci, Technol., 22 (2011) 115206 (10 pp).*

(Continued)

*Primary Examiner* — Jay C Chang
*Assistant Examiner* — Mikka Liu
(74) *Attorney, Agent, or Firm* — Tucker Ellis LLP

(57) ABSTRACT

We disclose herewith a heterostructure-based infra-red (IR) device comprising a substrate comprising an etched portion and a substrate portion; a device region on the etched portion and the substrate portion, the device region comprising a membrane region which is an area over the etched portion of the substrate. At least one heterostructure-based element is formed at least partially within or on the membrane region and the heterostructure-based element comprises at least one two dimensional carrier gas.

19 Claims, 10 Drawing Sheets

(51) Int. Cl.
| | |
|---|---|
| *H01L 31/0304* | (2006.01) |
| *H01L 35/30* | (2006.01) |
| *H01L 27/15* | (2006.01) |
| *H01L 31/109* | (2006.01) |
| *H01L 31/112* | (2006.01) |
| *H01L 27/144* | (2006.01) |
| *H01L 35/34* | (2006.01) |
| *H01L 31/18* | (2006.01) |
| *H01L 27/16* | (2006.01) |
| *H01L 35/22* | (2006.01) |
| *H01L 33/32* | (2010.01) |

(52) U.S. Cl.
CPC ...... *H01L 31/1856* (2013.01); *H01L 33/0041* (2013.01); *H01L 33/0075* (2013.01); *H01L 33/32* (2013.01); *H01L 35/22* (2013.01); *H01L 35/30* (2013.01); *H01L 35/34* (2013.01); *H05B 3/28* (2013.01)

(56) References Cited

U.S. PATENT DOCUMENTS

| | | | |
|---|---|---|---|
| 5,500,569 | A | 3/1996 | Blomberg et al. |
| 5,644,676 | A | 7/1997 | Blomberg et al. |
| 5,827,438 | A | 10/1998 | Blomberg et al. |
| 6,297,511 | B1 | 10/2001 | Syllaios et al. |
| 6,460,411 | B1 | 10/2002 | Kersjes et al. |
| 7,785,002 | B2 | 8/2010 | Dewes et al. |
| 8,809,786 | B2 | 8/2014 | Oulachgar et al. |
| 9,091,591 | B2 | 7/2015 | Park et al. |
| 9,297,638 | B1* | 3/2016 | Dyer .............. G01B 9/02001 |
| 2003/0223535 | A1* | 12/2003 | Leedy .............. B81C 1/00246 378/34 |
| 2008/0272389 | A1 | 11/2008 | Rogne et al. |
| 2012/0286161 | A1* | 11/2012 | Raieszadeh ............ G01J 5/06 250/338.3 |
| 2016/0109215 | A1 | 4/2016 | Dyer et al. |
| 2016/0216144 | A1 | 7/2016 | Figi et al. |
| 2017/0301535 | A1* | 10/2017 | Tanimoto .......... H01L 21/02458 |

OTHER PUBLICATIONS

Lahiji, G. R. and Kensall, D. Wise, "A Batch-Fabricated Silicon Thermopile Infrared Detector", IEEE (Jan. 1, 1982) 9 pages.

Allison, S.C., et al. "A bulk micromachined silicon thermopile with high sensitivity", Sensors and Actuators A 104 (2003); pp. 32-39.

Ji, Xinming, et al. "A MEMS IR Thermal Source for NDIR Gas Sensors", IEEE (2006), 3 pages.

Kim, Jae-Kwan, "A new uncooled thermal infrared detector using silicon diode", Sensors and Actuators A 89 (2001), pp. 22-27.

San, Haisheng, et al. "A silicon micromachined infrared emitter based on SOI waf", SPIE vol. 6836 68360N-1, 9 pages.

Fu, Han-Kuei, et al. "A thermal emitter with selective wavelength: Based on the coupling between photonic crystals and surface plasmon polaritons", Journal of Applied Physics 105, 033505 (2009), 6 pages.

De Zoysa, Menaka, et al. "Conversion of broadband to narrowband thermal emission through energy recycling", Nature Photonics published Jul. 8, 2002; 5 pages.

Bauer, D. et al. "Design and Fabrication of a thermal infrared emitter", Sensors and Actuators A 55 (1996), pp. 57-63.

Jiang, Yu-Wei, et al. "Enhancement of thermal radiation in plasmonic thermal emitter by surface plasmon resonance", IEEE (2008) 4 pages.

Spannhake, Jan, et al. "High-temperature MEMS Heater Platforms: Long-term Performance of Metal and Semiconductor Heater Materials", Sensors (2006) 6, pp. 405-419.

Shklover, Valery, et al. "High-tempurature Photonic Structures. Thermal Barrier Coatings, Infrared Source and Other Applications", American Scientific Publishers (2008) vol. 5; pp. 1-32.

Weber, M., et al. "Improved design for fast modulating IR sources", Journal of Micromechanics and Microengineering (1997); pp. 210-213.

Eminoglu, Selim, et al. "Low-cost uncooled infrared detectors in CMOS process", Sensors and Acutators A 109 (2003) pp. 102-113.

Li, Fangqiang, et al. "MEMS-based plasmon infrared emitter with hexagonal hole arrays perforated in the Al—SiO2—Si structure", Journal of Micromechanics and Microengineering, 21 (2011) 105023; 7 pages (8 with cover).

Hildenbrand, Jürgen, et al. "Micromachined Mid-Infrared Emitter for Fast Transient Temperature Operation for Optical Gas Sensing Systems", IEEE, vol. 10, No. 2 (Feb. 2010), pp. 353-362.

Parameswaran, M., et al., "Micromachined Thermal Radiation Emitter from a Commercial CMOS Process", IEEE, vol. 12, No. 2 (Feb. 1991); pp. 57-59.

Barritault, Pierre, et al. "Mid-IR source based on a free-standing microhotplate for autonomous CO2 sensing in indoor applications", Sensors and Actuators A 172 (2011) pp. 379-385.

Ji, Xinming, et al. "Narrow-band Midinfrared Thermal Emitter Based on Photonic Crystal for NDIR Gas Sensor", IEEE (2010); 3 pages.

Schneeberger, N., et al. "Optimized CMOS Infrared Detector Micorsystems", IEEE (1995), pp. 198-201.

Puscasu, Irina, et al. "Plasmonic Photonic Crystal MEMS Emitter for Combat ID", SPIE vol. 8031 80312Y-1; 7 pages.

Graf, A., et al. "Review of micromachined thermopiles for infrared detection", Measurement Science and Technology 18 (2007); 18 pages.

Yuasa, Hiroyasu, et al. "Single Crystal Silicon Micromachined Pulsed Infrared Light Source", IEEE (1997), 4 pages.

Sawada, Takahiro, et al. "Surface Plasmon Polariton Based Wavelength Selective IR Emitter Combined with Microheater", IEEE (2013), 2 pages.

Lenggenhager, Rene, et al. "Thermoelectric Infrared Sensors by CMOS Technology", IEEE (1992); 3 pages.

Tsai, Ming-Wei, et al. "Two Color Squared-lattice Plasmonic Thermal Emitter", IEEE (2006), 3 pages.

Huang, Shao-Yu, et al. "Triple Peaks Plasmonic Thermal Emitter with Selectable Wavelength Using Periodic Block Pattern as Top Layer", IEEE (2011); 4 pages.

Masayuki Abe et al., "High performance modulation doped AlGaAs/InGaAs thermopiles (H-PILEs) for Uncooled IR FPA Utilizing Integrated HEMT-MEMS Technology", The 25th International Conference on Indium Phosphide and Related Materials, 2013, Japan.

Yalamarthy et al., "Tuning electrical and thermal transport in AlGaN/GaN heterostructures via buffer layer engineering", Advanced Functional Materials, 2018, vol. 28, pp. 1705823-1705832.

European Search Report from corresponding Great Britian Application No. GB1904325.6 searched on Sep. 26, 2019.

B. Van Oudheusden, "Silicon flow sensors," in Control Theory and Applications, IEE Proceedings D (1988) pp. 373-380.

B. Van Oudheusden, "Silicon thermal flow sensors," Sensors and Actuators A: Physical, vol. 30 (1992) pp. 5-26.

N. Nguyen, "Micromachined flow sensors-A review," Flow measurement and Instrumentation, vol. 8 (1997) pp. 7-16.

Y.-H. Wang et al., "MEMS-based gas flow sensors," Microfluidics and nanofluidics, vol. 6 (2009) pp. 333-346.

J. T. Kuo et al., "Micromachined Thermal Flow Sensors-A Review," Micromachines, vol. 3 (2012) pp. 550-573.

A. Van Putten and S. Middelhoek, "Integrated silicon anemometer," Electronics Letters, vol. 10 (1974) pp. 425-426.

A. Van Putten, "An integrated silicon double bridge anemometer," Sensors and Actuators, vol. 4 (1983) pp. 387-396.

B. Van Oudheusden and J. Huijsing, "Integrated flow friction sensor," Sensors and Actuators, vol. 15 (1988) pp. 135-144.

J. H. Huijsing et al., "Monolithic integrated direction-sensitive flow sensor," Electron Devices, IEEE Transactions on, vol. 29 (1982) pp. 133-136.

W. S. Kuklinski et al., "Integrated-circuit bipolar transistor array for fluid-velocity measurements," Medical and Biological Engineering and Computing, vol. 19 (1981) pp. 662-664.

(56) References Cited

OTHER PUBLICATIONS

T. Qin-Yi and H. Jin-Biao, "A novel CMOS flow sensor with constant chip temperature (CCT) operation," Sensors and actuators, vol. 12 (1987) pp. 9-21.

D. Moser et al., "Silicon gas flow sensors using industrial CMOS and bipolar IC technology," Sensors and Actuators A: Physical, vol. 27 (1991) pp. 577-581.

L. Lofdahl et al., "A sensor based on silicon technology for turbulence measurements," Journal of Physics E: Scientific Instruments (1989) vol. 22, p. 391.

R. Kersjes et al., "An integrated sensor for invasive blood-velocity measurement," Sensors and Actuators A: Physical, vol. 37 (1993) pp. 674-678.

A. Van der Wiel et al., "A liquid velocity sensor based on the hot-wire principle," Sensors and Actuators A: Physical, vol. 37 (1993) pp. 693-697.

E. Yoon and K. D. Wise, "An integrated mass flow sensor with on-chip CMOS interface circuitry," Electron Devices, IEEE Transactions on, vol. 39 (1992) pp. 1376-1386.

N. Sabaté et al., "Multi-range silicon micromachined flow sensor," Sensors and Actuators A: Physical, vol. 110 (2004) pp. 282-288.

\* cited by examiner

Membrane region, 15

Membrane region, 15

INFRA-RED DEVICES

TECHNICAL FIELD

This disclosure relates to micro-machined thermal infrared (IR) devices. Particularly but not exclusively the disclosure relates to heterostructure-based IR emitters and IR detectors with tailored and electrically tunable optical properties.

BACKGROUND OF THE DISCLOSURE

It is well known how to fabricate thermal IR emitters. Such devices typically consist of a resistive micro-heater embedded within a thin membrane and supported on a substrate. When current is passed through the heater, it heats up to a high temperature (which can be as much as 700° C. or even higher), and at this high temperature the device emits IR radiation.

A large number of designs with IR emitters have been reported. For example, Parameswaran et al. "Micro-machined thermal emitter from a commercial CMOS process," IEEE EDL 1991 reports a polysilicon heater for IR applications made in CMOS technology, with a front side etch to suspend the heater and hence reduce power consumption. Similarly, Bauer et al. "Design and fabrication of a thermal infrared emitter" Sens & Act A 1996, also describes an IR source using a suspended polysilicon heater. U.S. Pat. No. 5,285,131 by Muller et al., US20080272389 by Rogne et al., and San et al. "A silicon micromachined infrared emitter based on SOI wafer" (Proc of SPIE 2007) also describe similar devices using a polysilicon heater.

Yuasa et al. "Single Crystal Silicon Micromachined Pulsed Infrared Light Source" Transducers 1997, describe an infrared emitter using a suspended boron doped single crystal silicon heater. In EP2056337 by Watanabe et al. describes a suspended silicon filament as an IR source. The device is vacuum sealed by bonding a second substrate.

Many designs based on a platinum heater have also been described. For example, Hildenbrand et al. "Micromachined Mid-Infrared Emitter for Fast Transient Temperature Operation for Optical Gas Sensing Systems", IEEE Sensor 2008 Conference, reports on a platinum heater on suspended membrane for IR applications.

Similarly Ji et al. "A MEMS IR Thermal Source For NDIR Gas Sensors" (IEEE 2006) and Barritault et al. "Mid-IR source based on a free-standing microhotplate for autonomous CO2 sensing in indoor applications" (Sensors & Actuators A 2011), Weber et al. "Improved design for fast modulating IR sources", Spannhake et al. "High-temperature MEMS Heater Platforms: Long-term Performance of Metal and Semiconductor Heater Materials" (Sensors 2006) also describe platinum based as well as other emitters.

Some other IR emitter designs are given by U.S. Pat. No. 6,297,511 by Syllaios et al., U.S. Pat. Nos. 5,500,569 5,644,676, 5827438 by Blomberg et al., and WO2002080620 by Pollien et al.

One limitation of many of these devices is that their emissivity is not optimal and specifically for the emitter, there is the possibility of electro-migration of the metal layer. There is also little control over the emission at specific wavelengths. For this purpose, the devices are often coated with different materials to improve the emissivity. Some materials used are metal blacks, carbon, carbon nanotubes and other thin film interference structures.

There have been several reports in literature that suggest that the emissivity of devices can be varied at particular wavelengths by using plasmonic structures, which are periodic structures created on a surface. For example these are described in Shklover et al., "High-Temperature Photonic Structures, Thermal Barrier Coatings, Infrared Sources and Other Applications," Journal of Computational and Theoretical Nanoscience, Vol. 5, 2008, pp. 862-893.

There are also several reports of IR emitters with plasmonic structures. For example, Tsai et al., "Two Color Squared-Lattice Plasmonic Thermal Emitter," Proceedings of Sixth IEEE Conference on Nanotechnology, Vol 2, pp 746-748, describes a silver/silicon dioxide/silver sandwich structure on a silicon substrate, where the top silver and/or silicon dioxide layer have a periodic pattern. The emission spectrum of the device shows peaks near 4 µm and 6 µm. Very similar devices are also described in Jiang et al., "Enhancement of thermal radiation in plasmonic thermal emitter by surface plasmon resonance," Proceeding of IEEE conference on Nanotechnology 2008, pp. 104-107, and in Fu et al., "A thermal emitter with selective wavelength: Based on the coupling between photonic crystals and surface plasmon polaritions," Journal of Applied Physics 105, 033505 (2009). Huang et al., "Triple peaks plasmonic thermal emitter with selectable wavelength using periodic block pattern as top layer," Proceedings of IEEE International Conference on Nanotechnology 2011 pp. 1267-1270, also describe a device based on silicon dioxide and silver layers, but using block shapes in different patterns at the top surface.

While all these designs are made to optimise the emission spectrum of the surface, these devices do not have an efficient mechanism for heating up. Either the heater is based on a metal layer at the back surface or need to be coupled to an external heater, which can result in very high power consumption. Unlike conventional miniaturised IR emitters, none of these devices are based on a membrane to isolate the heat and reduce power consumption.

There are a number of reports on MEMS based IR emitters with plasmonic structures. Ji et al. "Narrow-band Midinfrared Thermal Emitter Based on Photonic Crystal for NDIR Gas Sensor," Proceedings of IEEE ICSICT 2010, pp. 1459-1461 describes a platinum heater on top of a silicon nitride/silicon dioxide/silicon composite membrane, where all these layers are patterned with an array of holes in a square pattern. Li et al. "MEMS-based plasmon infrared emitter with hexagonal hole arrays perforated in the Al—SiO2 structure," Journal of Micromechanics and Microengineering 21 (2011) 105023, describe an aluminium heater on an silicon dioxide/silicon membrane, and all these layers have circular holes in them in a hexagonal pattern. While these designs will have lower power consumption due to the use of a membrane for thermal isolation, making holes through most of the membrane layers requires extra process steps, and can also structurally weaken the membrane as many of the layers, including the silicon dioxide layers, are perforated.

Puscasu et al. "Plasmonic Photonic Crystal MEMS Emitter for Combat ID," Proc of SPIE Vol 8031, 80312Y, describes a plasmonic structure coupled with a MEMS platform. The plasmonic structure consists of circular holes in a hexagonal pattern, while the platform is a heater suspended on a micro-bridge type membrane. Similarly, Sawada et al. "Surface Plasmon Polarities Based Wavelength Selective IR Emitter Combined with Microheater," proceedings of IEEE conference on Optical MEMS and Nanophotonics 2013, pp. 45-46, also describes an IR emitter which is suspended. Such suspended structures are less stable than full membrane structures.

Zoysa et al. "Conversion of broadband to narrowband thermal emission through energy recycling," Nature Photonics 2012, 20.12.146, describe an IR emitter based on a gallium arsenide (GaAs) substrate and a membrane consisting of GaAs/Al—GaAs heterostructures, with the membrane layers patterned into holes in a hexagonal pattern. In the report the heterostructure is not formed within the membrane region.

It is also known how to fabricate thermal IR detectors consisting of a thin membrane layer (made of electrically insulating layers) that is formed by etching part of the substrate. Incident IR radiation increases the membrane temperature, which can be measured by either a thermopile, a resistor, or a diode.

For example, Schneeberger et al. "Optimized CMOS Infrared Detector Microsystems," Proc IEEE Tencon. 1995, reports fabrication of CMOS IR detectors based on thermopiles. The thermopile consists of several thermocouples connected in series. KOH is used to etch the membrane and improve the thermal isolation. Each thermocouple consists of 2 strips of different materials, connected electrically and forming a thermal junction at one end (termed hot junction) while the other ends of the material are electrically connected to other thermocouples in series forming a thermal cold junction. The hot junctions of the thermocouples are on the membrane, while the cold junction is outside the membrane. Three different designs of the thermocouples are given in the paper with different material compositions: aluminium and p-doped polysilicon, aluminium and n-doped polysilicon, or p-doped polysilicon and n-doped polysilicon. Incident IR radiation causes a small increase in temperature of the membrane. The Seebeck effect causes a slight voltage difference across each thermocouple, resulting in a much large increase in voltage difference across the thermopile which is the sum of the voltages across each thermocouple.

Allison et al. "A bulk micromachined silicon thermopile with high sensitivity," Sensors and Actuators A 104 2003 32-39, describes a thermopile based on single crystal silicon p-doped and n-doped materials. Lahiji et al., "A Batch-fabricated Silicon Thermopile Infrared Detector," IEEE Transactions on Electron Devices" 1992, describe two thermopile IR detectors, one based on bismuth-antimony thermocouples, and the other based on polysilicon and gold thermocouples.

U.S. Pat. No. 7,785,002 by Dewes et al. describes an IR detector with a thermopile based on p-and n-doped polysilicon. Langgenhager et al. "Thermoelectric Infrared Sensors by CMOS Technology," IEEE EDL 1992, describes IR detectors consisting of thermopiles on a suspended structure consisting of aluminium and polysilicon.

Several other thermopile devices are described by Graf et al. "Review of micromachined thermopiles for infrared detection," Meas. Sci. Technol. 2007.

Similarly, thermodiode based IR detectors can also be made. Kim et al. "A new uncooled thermal infrared detector using silicon diode" Sens & Act A 89 (2001) 22-27 describes a diode for use as an IR detector. Eminoglu et al. "Low-cost uncooled infrared detectors in CMOS process" describes an IR detector using diodes on a microbridge membrane fabricated in a CMOS process Sens & Act A 109 (2003) 102-113.

Similarly, bolometer-type IR detectors can be made. In U.S. Pat. No. 29,261,411 by Oulachgar et al. and U.S. Pat. No. 9,091,591 by Park et al. uncooled microbolometer detectors are disclosed.

SUMMARY

It is an object of this disclosure to provide a micromachined heterostructure-based infra-red (IR) device comprising a two dimensional carrier gas; wherein the device may be configured to operate as IR emitter or IR detector; and wherein the two dimensional carrier gas (either electron-based, 2DEG, or hole-based, 2DHG) may be used: (i) for heat generation, (ii) for temperature sensing, (iii) for tailoring the optical properties of the IR device, and (iv) for electrically tuning the optical properties of the IR device.

The devices of the disclosure are advantageous over the state of the art devices as it provides a micromachined IR device with optical properties tailored to match the specific application (e.g. for carbon dioxide non-dispersive infra-red, NDIR, detection is desirable to have IR devices with emissivity/absorptivity enhanced around 4.26 um). Furthermore, the disclosure provides a micromachined IR device with electrically tunable optical properties, which is a feature particularly desirable to realise NDIR sensors able to detect multiple gas species or to realise hyperspectral imagers. Furthermore, the disclosure benefits from the employment of a heterostructure-based device comprising a two dimensional carrier gas configured to operate as a heating element (i.e. for heat generation) as in such element electromigration will not be as influential as in other metallic- and semiconducting-based heating elements. Furthermore, the disclosure benefits from the employment of a heterostructure-based element comprising a two dimensional carrier gas configured to operate as a temperature sensing element as it is known that the electrical characteristics of such elements are extremely sensitive to temperature variations. Furthermore, the disclosure provides an IR device employing a thermal isolation scheme (e.g. a membrane) beneficial to: (i) reduce power dissipation (if the device is configured to operate as a heating element), (ii) improve sensitivity (if the device is configured to operate as a temperature sensing element), (iii) improve thermal dynamics (heating/cooling times) of the IR devices, while concurrently providing the device with a mechanically stable structure.

According to one aspect of the present disclosure, there is provided a heterostructure-based infra-red (IR) device comprising a substrate comprising an etched portion and a substrate portion; a device region on the etched portion and the substrate portion, the device region comprising a membrane region which is an area over the etched portion of the substrate. At least one heterostructure-based element is formed at least partially within or on the membrane region and the heterostructure-based element comprises at least one two dimensional carrier gas. Here the device region refers to a region including a nucleation region, a transition region, an active region, dielectric layers, passivation layers and metal layers. The heterostructure is formed within the active region of the device region. The heterostructure is generally formed at least partially within the membrane region which is the area directly on top or over the etched portion of the substrate. In other words, an area of the device region which is directly on top of or corresponding to the etched portion of the substrate is the membrane region. The heterostructure is generally partially or fully within the membrane region.

Aspects and preferred features are set out in the accompanying claims.

According to the present disclosure, there is provided a heterostructure-based infra-red device comprising: a substrate comprising an etched portion; a first layer located on the substrate, wherein the first layer comprises a membrane over an area of the etched portion of the substrate; a heterostructure-based element formed within the membrane region where a two dimensional carrier gas is formed at the heterointerface between semiconductor layers of dissimilar bandgap. Notably the term "heterostructure-based" does not put any limit on the number and type of the heterostructures forming the device; the device may be based on a single heterostructure, on a double heterostructure, etc. the device may also be based on a straddling gap (type I), staggered (Type II), or broken gap (type III) heterostructures.

Preferably, the starting substrate is silicon. However, any other substrate combining silicon with another semiconducting material compatible with state-of-the-art fabrication processes may be used. Employment of a silicon substrate facilitates etching techniques, guarantees sensor manufacturability in high volume, low cost, high reproducibility and wide availability of foundries supporting the process. Furthermore, a silicon substrate allows CMOS processes to be used and thus enables on-substrate circuitry integration for sensor performance enhancement and system integration facilitation. Alternative substrate materials may include sapphire, silicon carbide (SiC), gallium nitride (GaN), and gallium arsenide (GaAs). Other alternatives may also be possible. Also, this disclosure covers the possibility of growing the heterostructure on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The semiconductor layers forming any of the heterostructures included in this disclosure may be formed using any one of Metal-Organic Chemical Vapour Deposition (MOCVD) and Molecular Beam Epitaxy (MBE) growth techniques. Other alternative growth techniques may also be possible.

The membrane or membranes may be formed by back-etching using Deep Reactive Ion Etching (DRIE) of the substrate, which results in vertical sidewalls and thus enabling a reduction in sensor size and costs. However, the back-etching can also be done by using anisotropic etching such as KOH (Potassium Hydroxide) or TMAH (TetraMethyl Ammonium Hydroxide) which results in slopping sidewalls. The membrane can also be formed by a front-side etch or a combination of a front-side and back-side etch to result in a suspended membrane structure, supported only by one or more beams. The membrane may be circular, rectangular, or rectangular shaped with rounded corners to reduce the stresses in the corners, but other shapes are possible as well.

The membrane may comprise a nucleation region, a transition region and dielectric regions of, for example, silicon dioxide and/or silicon nitride. The membrane may also comprise one or more layers of spin on glass, and a passivation layer. The employment of materials with low thermal conductivity (e.g. dielectrics) enables a significant reduction in power dissipation as well as an increase in the temperature gradients within the membrane with direct benefits in terms of sensor performance (e.g. sensitivity and frequency response). In case the substrate is silicon and the heterostructure is based on III-Nitride compounds such as GaN, the nucleation region may be made of aluminium nitride (AlN) or any available dielectric layer (for example $SiO_2$), and the transition region may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The heterostructure formed within the membrane region comprising a two dimensional carrier gas (either hole gas or electron gas) may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructure will be an AlGaN/GaN heterostructure comprising a two dimensional electron gas (2DEG); this will be used for illustrative purposes in the embodiments hereafter and in the accompanying drawings.

The AlIGaN/GaN device formed within the membrane region and comprising a 2DEG, may further comprise electrical connections bridging from within the membrane area to the substrate area of the chip. The electrical connections may be formed using any one or a combination of the metal layers or metallic alloy layers available in a state-of-the-art process (e.g. aluminium, tungsten, titanium, titanium nitride, copper, platinum, gold, chromium, etc.). Alternatively, the electrical connections may be formed using any one or a combination of the materials forming the heterostructure (e.g. $Al_xGaN_{1-x}N$, n-doped $Al_xGaN_{1-x}N$, p-doped $Al_xGaN_{1-x}N$). Alternatively, the electrical connections may be formed using the 2DEG formed at the AlGaN/GaN interface. Notably, the 2DEG used for the electrical connection may show different electrical properties (e.g. in terms of charge density) from the 2DEG comprised in the AlGaN/GaN element formed within the membrane. It will be understood that generally speaking heterostructure includes $A_xGaN_{1-x}N$ and this is applicable for all the embodiments.

According to one embodiment of the present disclosure, there is provided a micromachined AlGaN/GaN-based IR device configured to operate as IR emitter, wherein the AlGaN/GaN element formed within the membrane region and comprising a 2DEG is configured to operate as a heating element. The current flow within the 2DEG resistive heating element results in Joule heating, and generates IR radiation. The heating element may comprise any one or a combination of the 2DEG layers, the materials forming the heterostructure (e.g. $Al_xGaN_{1-x}N$, n-doped $Al_xGaN_{1-x}N$, p-doped $Al_xGaN_{1-x}N$), and metal or metallic alloy layers available in a state-of-the-art process (e.g. aluminium, tungsten, titanium, titanium nitride, copper, platinum, gold, chromium, etc.). The heating element may be a passive device (i.e. a self-heated resistor). Alternatively, the heating element may be an active device (e.g. a self-heated diode, a self-heated transistor or a self-heated transistor in diode configuration). The use of a transistor (e.g. a high electron mobility transistor, HEMT) will allow direct temperature modulation (i.e. modulation of the gate results in modulation of the current flow, and thus of the Joule heating effect) without the use of an external transistor. The heating element may have a meander shape, a spiral shape, a ring shape, a multi ring shape. Many other alternatives are also possible. The heating element may also comprise one or more heat spreading plates to engineer the temperature distribution within the membrane and/or the mechanical properties of the membrane.

According to another embodiment of the present disclosure, there is provided a micromachined AlGaN/GaN-based IR device configured to operate as IR detector, wherein the AlGaN/GaN element formed within the membrane region and comprising a 2DEG is configured to operate as a temperature sensing element. IR radiation coming onto the device surface generates an increase in the membrane temperature sensed by the temperature sensing element. The temperature sensing element may comprise any one or a combination of the 2DEG layers, the materials forming the heterostructure (e.g. $Al_xGaN_{1-x}N$, n-doped $Al_xGaN_{1-x}N$, p-doped $Al_xGaN_{1-x}N$), and metal or metallic alloy layers available in a state-of-the-art process (e.g. aluminium, tungsten, titanium, titanium nitride, copper, platinum, gold, chromium, etc.). The temperature sensing element may be in form of a resistor; wherein the resistor resistance variation upon IR radiation illumination may be used as IR detection mechanism. This sensing mechanism is proper of devices usually referred to as bolometers. Alternatively the temperature sensing element may be in form of a thermopile; wherein the thermopile may be formed by a plurality of thermocouples; wherein each thermocouple may be formed by two arms (or legs) joint together to form a hot junction located within the membrane and a cold junction located outside the membrane area; wherein the hot and cold junction may be formed by using metal links to join the two dissimilar materials forming each thermocouple leg and thus avoid the formation of rectifying junctions. The voltage built across the thermopile terminals upon IR illumination may be used as IR detection mechanism. This mechanism is usually referred to as Seebeck effect. Alternatively, the temperature sensing element may be in form of an active device (e.g. a diode, a transistor or a transistor in diode configuration) or in form of an array of active devices, as this is known to increase the overall temperature sensitivity. Another option may also be to have a temperature sensing element formed by a combination of the previous alternatives (e.g. a diode in series to a resistor, a resistor in series to a thermopile, etc.). The geometry of the temperature sensing element may be any desirable to achieve specific performance.

According to another embodiment of the present disclosure, there is provided a micromachined AlGaN/GaN-based IR device, wherein the AlGaN/GaN element formed within the membrane region and comprising a 2DEG is configured to tailor the optical properties of the IR device. The optical properties (reflectivity, transmittivity, emissivity and absorptivity) of multilayer structures are exclusively determined by the thicknesses and the intrinsic properties (real and imaginary part of the dielectric constant, or equivalently refractive index and extinction coefficient) of the materials forming the multilayer structure. However, it is possible to engineer the optical properties by introducing period structures exploiting plasmonic resonances to modify the native overall optical properties of a multilayer structure. For simplicity, the AlGaN/GaN element formed within the membrane region, comprising a 2DEG, and configured to tailor the optical properties of the IR device will be referred to as a plasmonic element hereafter. The plasmonic element is a patterned periodic structure, wherein the term "periodic structure" refers to the arrangement in which a patterned layer has a plurality of laterally spaced structures. The layer patterned in the periodic structure may be any one or a combination of the 2DEG layers, the materials forming the heterostructure (e.g. $Al_xGaN_{1-x}N$, n-doped $Al_xGaN_{1-x}N$, p-doped $Al_xGaN_{1-x}N$), the metal or metallic alloy layers available in a state-of-the-art process (e.g. aluminium, tungsten, titanium, titanium nitride, copper, platinum, gold, chromium, etc.), and the dielectric/passivation regions forming the membrane. This layer may be either embedded within the membrane or be above or below the membrane. The layer may be patterned as a series of circular dots arranged in a hexagonal pattern, a square/rectangular pattern or any other arrangement. However, the dots may be a circle, square, triangle, a trapezoid, rectangle, cross, or any other shape. Alternately the layer may be patterned as a series of holes in a hexagonal or square/rectangular pattern or any other arrangement. The holes may be a circle, square, triangle, a trapezoid, rectangle, cross or any other shape. The periodicity may be constant from dot to dot or hole to hole (i.e. the same distance between each dot or hole). Alternatively, it can vary in a periodic manner. For example, a pattern where the dot distance changes from dot to dot, but this dot distance pattern may be repeated after a set number of dots. A similar pattern may also be used for a hole pattern.

According to another embodiment of the present disclosure, there is provided a micromachined AlGaN/GaN-based IR device, wherein the AlGaN/GaN element formed within the membrane region and comprising a 2DEG is configured to tailor and electrically tune the optical properties of the IR device. The optical properties (reflectivity, transmittivity, emissivity and absorptivity) of multilayer structures are exclusively determined by the thicknesses and the intrinsic properties (real and imaginary part of the dielectric constant, or equivalently refractive index and extinction coefficient) of the materials forming the multilayer structure. However, it is possible to engineer and electrically tune the optical properties by introducing period structures exploiting plasmonic resonances to modify the native overall optical properties of a multilayer structure and concurrently introducing a 2DEG within or in close proximity of the region of plasmonically enhanced field. Electrical modulation of the electron density within the 2DEG will result in control over the optical properties. For simplicity, the AlGaN/GaN element formed within the membrane region, comprising a 2DEG, and configured to tailor and electrically tune the optical properties of the IR device will be referred to as tunable plasmonic element hereafter. The tunable plasmonic element is a patterned periodic structure, wherein the term "periodic structure" refers to the arrangement in which a patterned layer has a plurality of laterally spaced structures, and wherein the patterned periodic structure also comprises a 2DEG within or in close proximity of the region of plasmonically enhanced field. The layer patterned in the periodic structure may be any one or a combination of the 2DEG layer, the materials forming the heterostructure (e.g. $Al_xGaN_{1-x}N$, n-doped p-doped $Al_xGaN_{1-x}N$), the metal or metallic alloy layers available in a state-of-the-art process (e.g. aluminium, tungsten, titanium, titanium nitride, copper, platinum, gold, chromium, etc.), and the dielectric/passivation regions forming the membrane. This layer may be either embedded within the membrane or be above or below the membrane. The layer may be patterned as a series of circular dots arranged in a hexagonal pattern, a square/rectangular pattern or any other arrangement. However, the dots may be a circle, square, triangle, a trapezoid, rectangle, cross, or any other shape. Alternately, the layer may be patterned as a series of holes in a hexagonal or square/rectangular pattern or any other arrangement. The holes may be a circle, square, triangle, a trapezoid, rectangle, cross or any other shape. The periodicity may be constant from dot to dot or hole to hole (i.e. the same distance between each dot or hole). Alternatively, it can vary in a periodic manner. For example, a pattern where the dot distance changes from dot to dot, but this dot distance pattern may be repeated after a set number of dots. A similar pattern may also be used for a hole pattern.

According to another embodiment of the present disclosure, there is provided a micromachined AlGaN/GaN-based IR device, wherein two or more of the previously described AlGaN/GaN elements (i.e. the heating element, the temperature sensing element, the plasmonic element and the tunable plasmonic element) are formed within the membrane region and wherein at least one of the previously described AlGaN/GaN elements comprises a 2DEG. For example, a heating element and a plasmonic element may be formed within the membrane, to realise an IR emitter with tailored optical properties. Alternatively, a temperature sensing element and a plasmonic element may be formed within the membrane, to realise an IR detector with tailored optical properties. Alternatively, a heating element and a tunable plasmonic element may be formed within the membrane, to realise an IR emitter with electrically tunable optical properties. Alternatively, a temperature sensing element and a tunable plasmonic element may be formed within the membrane, to realise an IR detector with electrically tunable optical properties. It will be understood that in case the two or more of the previously described AlGaN/GaN elements (i.e. the heating element, the temperature sensing element, the plasmonic element and the tunable plasmonic element) use a 2DEG to be employed to achieve specific performance a multi heterostructure approach will be needed. For example, if both the heating element and the plasmonic element formed within the membrane to realise an IR emitter with tailored optical properties respectively use a 2DEG resistor and a periodically patterned 2DEG, the 2DEG resistor may be comprised within a first bottom heterostructure and the periodically patterned 2DEG may be comprised within a second top heterostructure.

According to another embodiment of the present disclosure, there is provided a micromachined AlGaN/GaN-based IR device, wherein the element formed within the membrane region and comprising a 2DEG may be a plasmonic element or a tunable plasmonic element, and wherein the AlGaN/GaN-based IR device is 3D stack on a second IR device. The second IR device may be any of the devices previously disclosed or any other IR device, even realised in a different technology (e.g. a CMOS IR emitter or a CMOS IR detector), in order to provide the second IR device with optical properties different from its native ones. The stacking process may take place at wafer level and may allow the creation of a cavity at low pressure (lower than ambient pressure), in order to reduce thermal dissipation and thus improve the second IR device performance.

In another embodiment of the disclosure, the heterostructure-based IR device comprises an array of several membranes, wherein each membrane may comprise a previously disclosed element (i.e. a heating element, a temperature sensing element, a plasmonic element and a tunable plasmonic element) or a combination of those. The devices may be the same or different across the array. For example heterostructure-based IR device may comprise an array of heating elements, or in an array of temperature sensing elements, configured respectively to operate as an array of IR emitters or as an array of IR detectors. Each IR device within the array of IR devices may have the same design, wherein such redundancy may improve the overall IR device array lifetime, or each IR device within the array of IR devices may have the different design. For example in case the array of IR devices is an array of IR emitters with tailored optical properties, wherein each IR emitter may be design to emit IR radiation in a specific wavelength region, thus the array of IR emitters with tailored optical properties may be used for spectroscopic analysis. In another example, the array of IR devices is an array of IR detectors with tailored optical properties, wherein each IR detector may be design to detect IR radiation in a specific wavelength region, thus the array of IR detectors with tailored optical properties may be used for spectroscopic analysis or multispectral imaging. Another use of the array of IR emitters may be to compensate for drift. For example, in an array of two, only one maybe used regularly, and the other one turned on only occasionally to calibrate the drift of the main heating element. Alternately, two or more heating elements may be driven in a cycle so that only one is on at any given time, and so increase the overall lifetime of the device. Another use of the array is to have an array of smaller membranes instead of one large membrane. A large membrane is mechanically less stable compared to a small membrane, but a small membrane device will have lower IR emissions. By using an array of small membranes, the mechanical stability of a small membrane can be achieved while having high levels of IR emission. The heating elements may be electrically connected either so that they are driven together at the same time, or driven individually. In another example, the array of IR devices may comprise both IR emitters and IR detectors.

In another embodiment of the disclosure, the heterostructure-based IR device is covered (either fully or in pre-specified areas) with a coating to improve the IR emission/absorption. This coating can be of any type, such as carefully controlled layers of silicon oxide, silicon nitride or polymers (e.g. polyimide). Alternately materials such as carbon black, carbon nanotubes, metal oxides, black gold, black platinum or graphene or combination of such materials can be grown or deposited on the micro-hotplate. These materials have high emissivity/absorptivity and therefore improve the amount of IR emitted/detected. Other materials may also be used. Materials may be deposited via techniques similar to inkjet or nano depositions or can be grown via CVD across the entire wafer or only locally using the heating element as the source of heat during growth. Several heating elements may be connected together across the silicon wafer to facilitate local growth. A porous or a high surface to volume ratio layer or a nanostructured layer can also be placed above or below the membrane region to enhance absorption and/or emissions.

In one embodiment, analogue/digital circuitry may be integrated on-chip. Circuitry may comprise IPTAT, VPTAT (or any temperature sensor, such as the sensing element described in the previous embodiments, and placed outside the membrane area for ambient/package/case temperature monitoring purposes), amplifiers, switches, multiplexers, demultiplexers, analogue to digital converters, memories, RF communication circuits, timing blocks, filters or any other mean to drive and read out the heterostructure-based IR device or electronically manipulate the device signals. For example, it is demonstrated that a heating element driven in constant temperature mode results in enhanced performance and having on-chip means to implement this driving method would result in a significant advancement of the state-of-the-art. The on-chip circuitry may be either realised in the substrate of the heterostructure-based IR device (in case the substrate is silicon this would enable monolithic integration of CMOS circuitry along with the heterostructure-based IR device) or within one of the heterostructures forming the heterostructure-based IR device (in case the heterostructure comprises wide bandgap materials, the circuitry would be able to withstand high ambient temperature operations, due to reduced leakage current within the devices). In absence of on-chip circuitry, this disclosure also covers the off-chip implementation of such circuital blocks when applied to a heterostructure-based IR device having one or more features described in any of the previous embodiments. Such off-chip implementation may be done in an ASIC or by discrete components, or a mix of the two.

The heterostructure-based IR device may be packaged in a metal TO type package, in a ceramic, metal or plastic SMD (surface mount device) package. The device may also be packaged directly on a PCB, or be packaged in a flip-chip method. The device may also be embedded in a substrate, such as a customised version of one of the previously mentioned package, a rigid PCB, a semi-rigid PCB, flexible PCB, or any other substrate, in order to reduce the overall size of the packaged device. The device membrane may be hermetically or semi-hermetically sealed with a gas (e.g. air, dry air, argon, nitrogen, xenon or any other gas). The device may also be packaged in a vacuum. The package can also be a chip or wafer level package, formed for example by wafer-bonding. The device may be also packaged with a filter (either a narrow band or a broadband), with a reflector, or with a lens, or any other mean to affect the spectrum, the direction or the polarization of the IR radiation emitted or absorbed by the heterostructure-based IR device.

The heterostructure-based IR device may have through silicon vias (TSV). Advantageously, the employment of TSVs can enable 3D stacking techniques. For instance the device can sit on top of an ASIC, thus reducing the overall system footprint.

The heterostructure-based IR device may be used in applications ranging from IR gas sensing (single and multiple gas species detection), night vision, thermal imaging, multi- and hyper-spectral imaging, to occupancy/people presence detection, motion detection, flame detection, remote temperature measurements, etc., in a variety of fields (automotive, consumer electronics, robotics and machine vision, medical, security and surveillance, aerospace and defence, sports and entertainments, environmental, etc.) Interestingly, this disclosure may also access harsh environment applications (whereby extreme temperatures, corrosive media, mechanical stresses/vibrations/shocks, or electromagnetic interferences due to electromagnetic radiation, neutrons, gamma rays energetic ions, etc., are involved).

According to a further aspect of the present disclosure there is provided a method of manufacturing a heterostructure-based IR device, the method comprising: forming at least one membrane on a substrate comprising an etched portion, wherein the membrane is over an area of the etched portion; and forming at least one heterostructure-based IR element within the at least one membrane region, wherein the at least one heterostructure-based IR element comprises a two dimensional carrier gas.

Many other effective alternatives will occur to the person skilled in the art. It will be understood the disclosure is not limited to the described embodiments, but encompasses all the modifications which fall within the spirit of the disclosure.

BRIEF DESCRIPTION OF THE PREFERRED EMBODIMENTS

Some preferred embodiments of the disclosure will now be described by way of example only and with reference to the accompanying drawings, in which.

Figure 13:
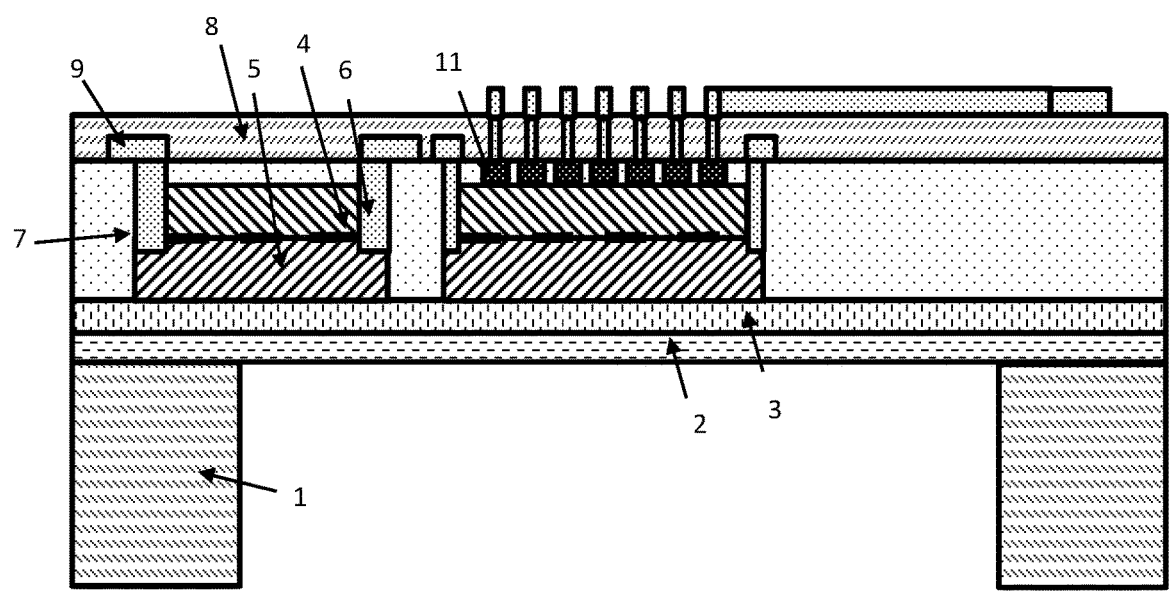
Figure 14:
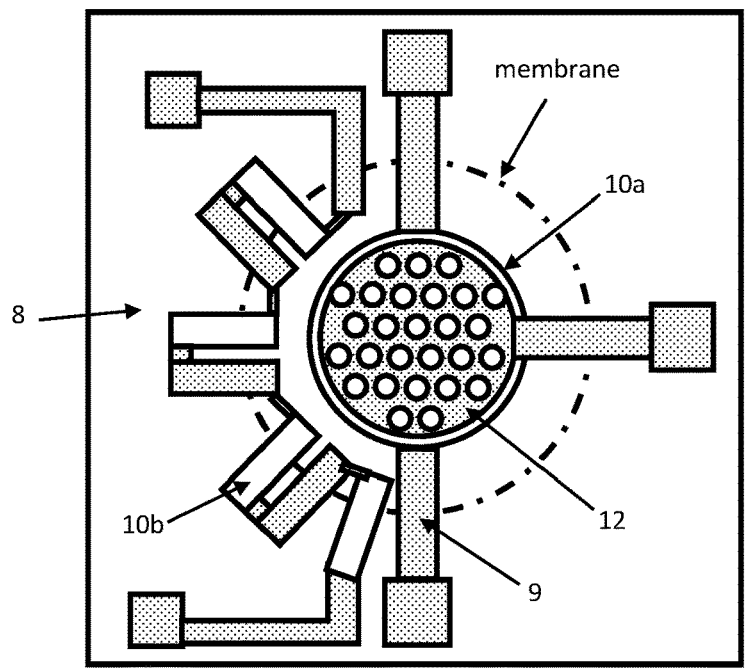
Figure 15:
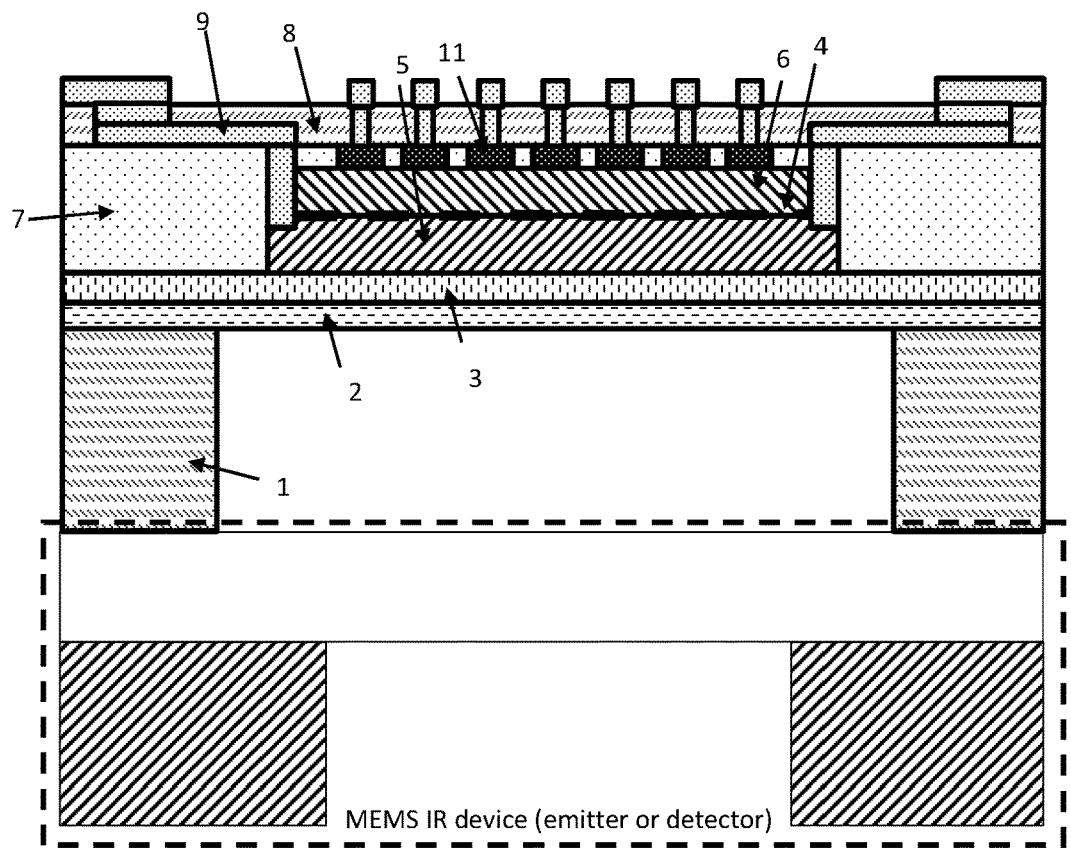
Figure 16:
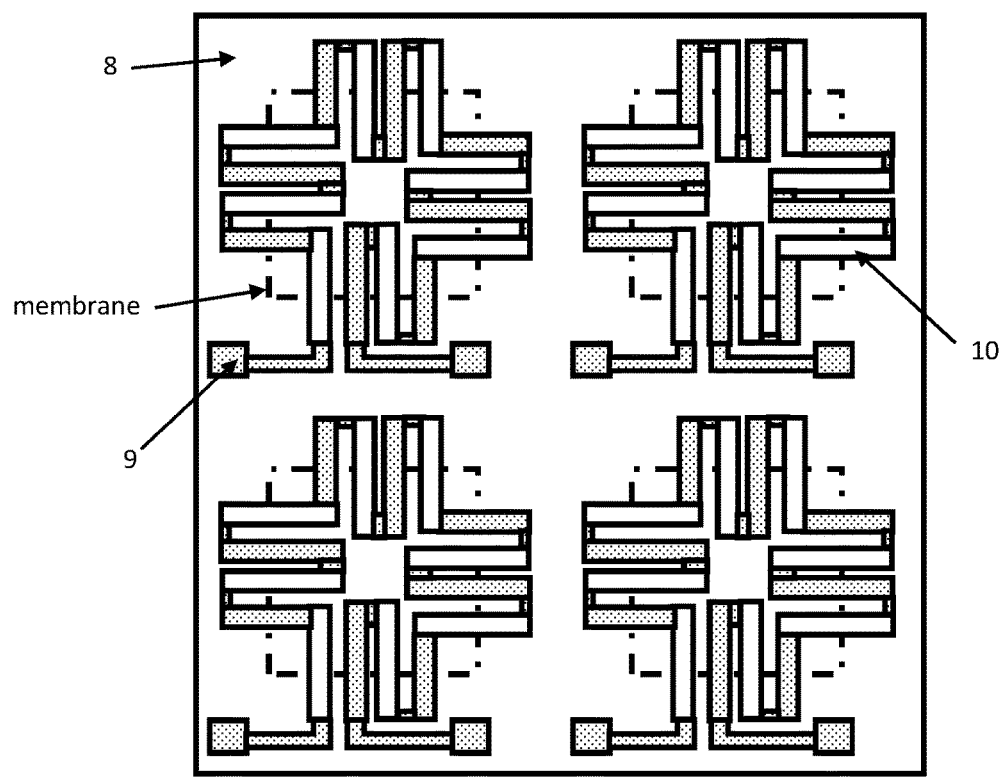
Figure 17:
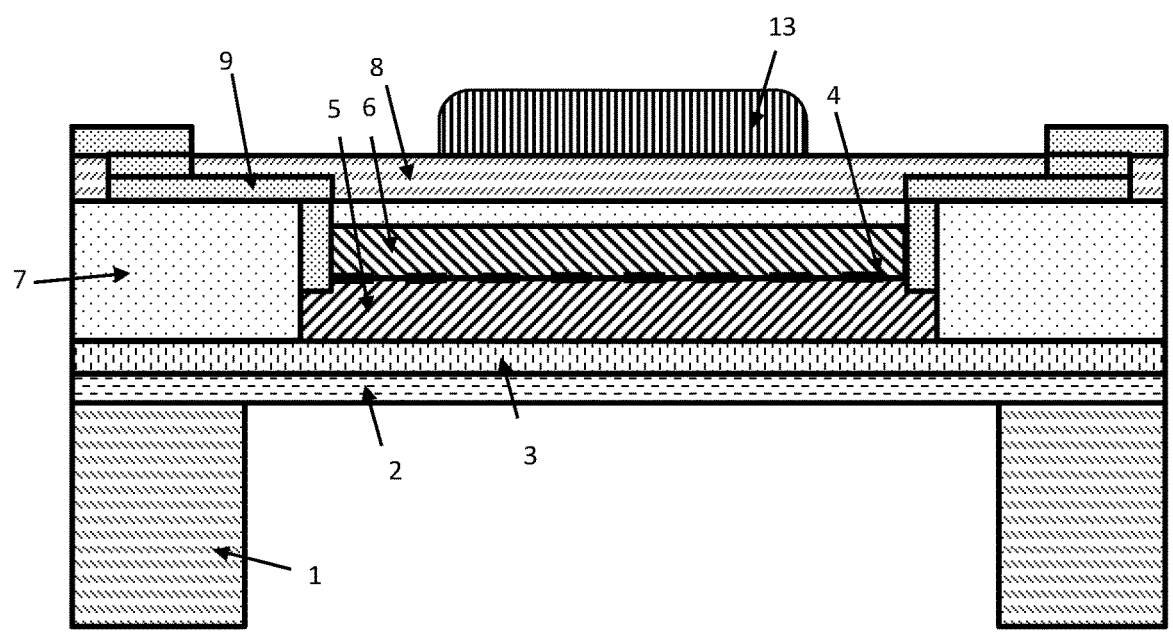
Figure 18:
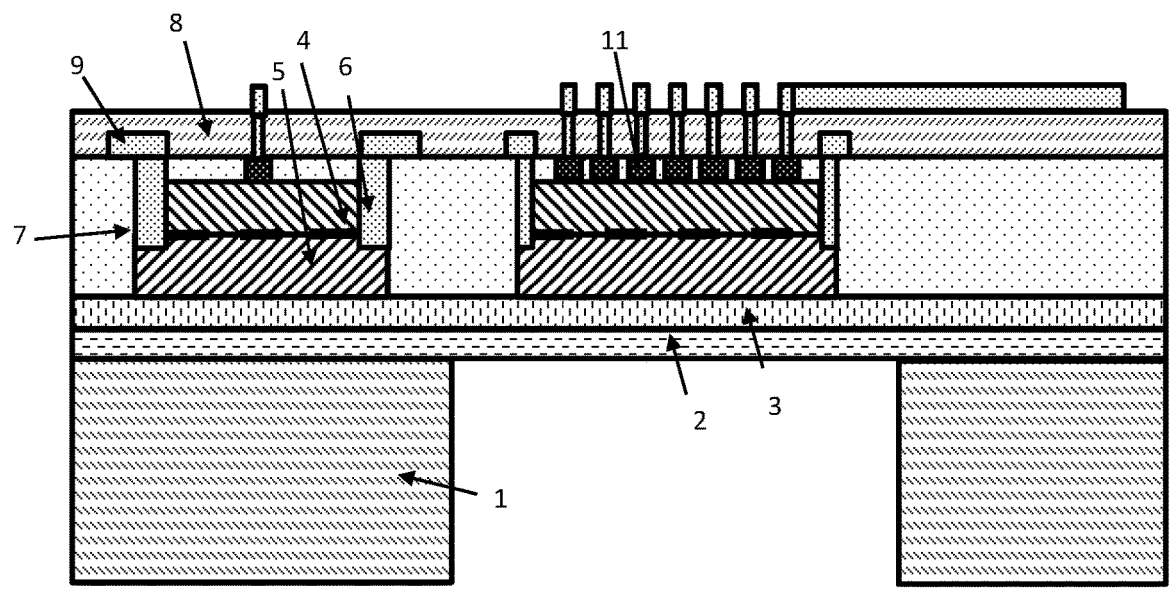

FIG. 13 shows a cross section of a heterostructure-based infra-red device that can be operated as IR detector. The temperature sensing element is in form of a thermopile. The IR detector optical properties are engineered and electrically tuned by mean of a HEMT with a patterned gate;

FIG. 14 shows a top view of a heterostructure-based infra-red device that can be operated as IR detector. The temperature sensing element is in form of a thermopile. The IR detector optical properties are engineered and electrically tuned by mean of a HEMT with a patterned gate;

FIG. 15 shows a cross section of a heterostructure-based infra-red device 3D stacked on top of a MEMS IR device. The heterostructure based IR device is used to engineer and electrically tune by mean of a HEMT with a patterned gate the optical properties of the MEMS IR device below it;

FIG. 16 shows a top view of a 2×2 array of heterostructure-based infra-red devices that can be operated as IR detector array (IR camera). The temperature sensing elements are in form of thermopiles;

FIG. 17 shows a cross section of a heterostructure-based infra-red device that can be operated as IR emitter and/or as IR detector, having an emission/absorption coating; and FIG. 18 shows a cross section of a heterostructure-based infra-red device that can be operated as IR emitter and/or as IR detector. The heating element and/or the temperature sensing element is in form of an HEMT with a patterned gate. Additional the IR device is provided with on-chip circuitry.

DETAILED DESCRIPTION OF THE PREFERRED EMBODIMENTS

Figure 1:
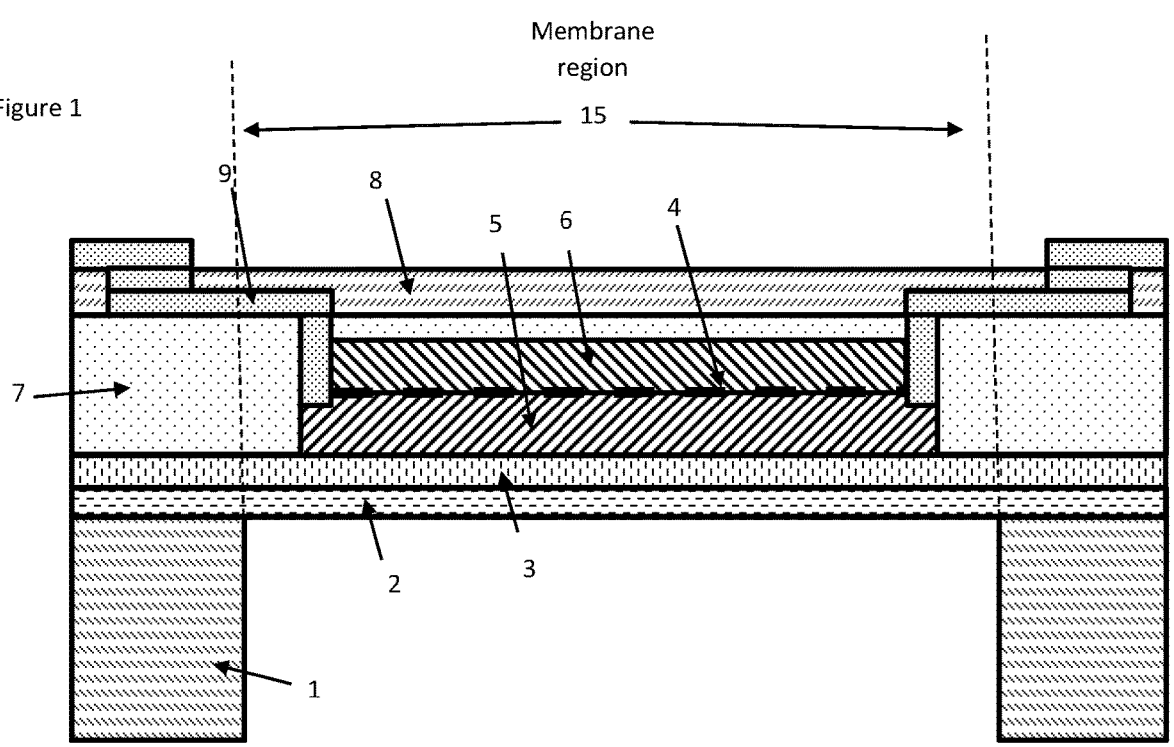
FIG. 1 shows a cross section of a heterostructure-based infra-red device that can be operated as IR emitter and/or as IR detector.

FIG. 1 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region 15 where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The AlGaN/GaN-based IR device may be configured to operate as IR emitter, wherein the AlGaN/GaN element formed within the membrane region and comprising a 2DEG is configured to operate as a heating element. The current flow within the 2DEG resistive heating element results in Joule heating, and generates IR radiation. Alternatively the AlGaN/GaN-based IR device may be configured to operate as IR detector, wherein the AlGaN/GaN element formed within the membrane region and comprising a 2DEG is configured to operate as a resistive temperature sensing element. IR radiation coming onto the device surface generates an increase in the membrane temperature sensed by the resistive temperature sensing element. Generally speaking, the membrane region 15 is located immediately adjacent or directly above or over the etched portion of the substrate 1. The membrane region 15 corresponds to the area directly above the cavity (or the etched portion) of the substrate 1. The definition of the membrane region 15 as shown in FIG. 1 is applicable in the remaining embodiments and figures described below.

Figure 2:
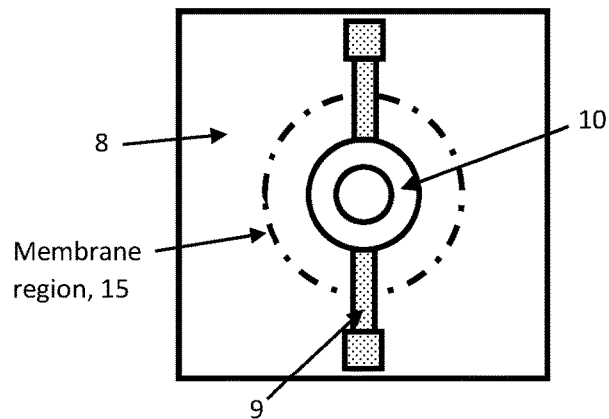
FIG. 2 shows a top view of a heterostructure-based infra-red device that can be operated as IR emitter and/or as IR detector.

FIG. 2 is a schematic top view of a heterostructure-based infra-red device, wherein the AlGaN/GaN element 10 formed within the membrane region and comprising a 2DEG may be configured to operate as a resistive heating element. The current flow within the 2DEG resistive heating element results in Joule heating, and generates IR radiation. Alternatively, the AlGaN/GaN element 10 formed within the membrane region and comprising a 2DEG may be configured to operate as a resistive temperature sensing element. IR radiation coming onto the device surface generates an increase in the membrane temperature sensed by the resistive temperature sensing element. In this specific example the element 10 is chosen to be ring-shaped, but its shape could be any desired by the specific application (e.g. multi ring, spiral, meander, etc.).

Figure 3:
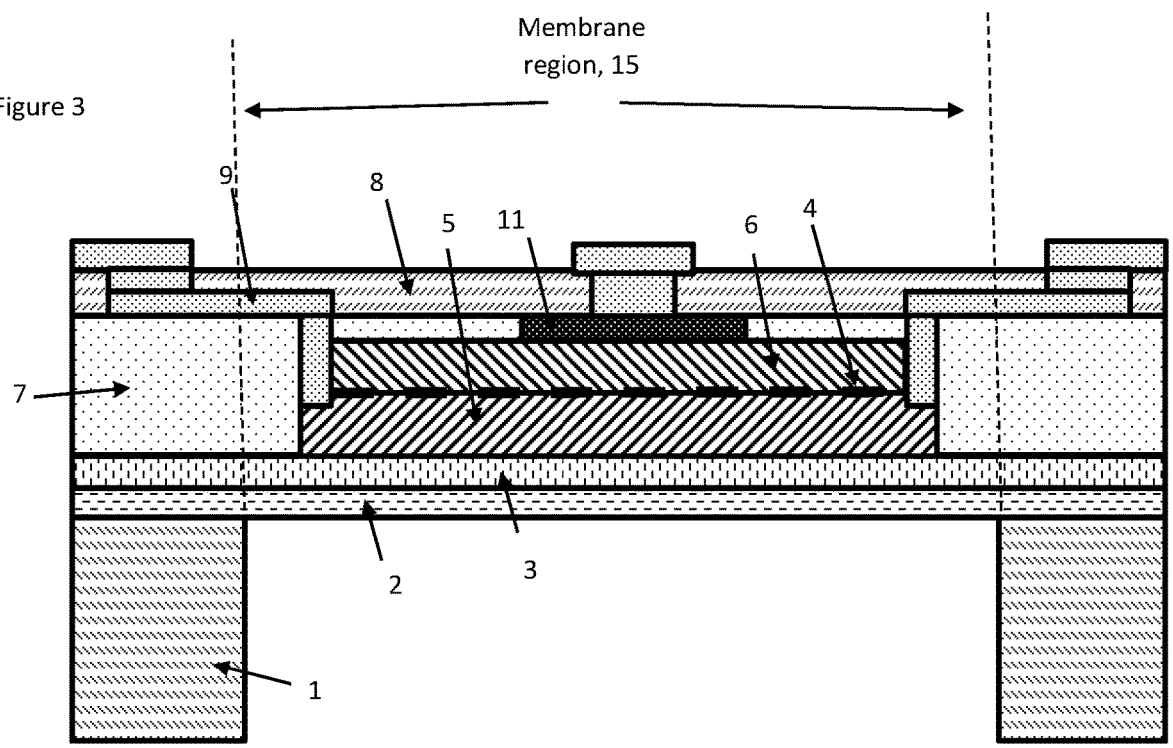
FIG. 3 shows a cross section of a heterostructure-based infra-red device that can be operated as IR emitter and/or as IR detector. The heating element and/or the temperature sensing element is in form of an HEMT.

FIG. 3 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the heterostructure-based device is provided with a gate 11, to modulate the carrier concentration. The AlGaN/GaN-based IR device may be configured to operate as IR emitter, wherein the AlGaN/GaN element formed within the membrane region and comprising a 2DEG is a transistor (e.g. HEMT), and is configured to operate as a heating element. The current flow within the 2DEG results in Joule heating, and generates IR radiation. The use of the gate will allow direct temperature modulation of the heating element, without the use of an external transistor. Alternatively the AlGaN/GaN-based IR device may be configured to operate as IR detector, wherein the AlGaN/GaN element formed within the membrane region and comprising a 2DEG is a transistor (e.g. HEMT), and is configured to operate as a temperature sensing element. IR radiation coming onto the device surface generates an increase in the membrane temperature sensed by the temperature sensing transistor. The presence of the gate 11 will enable the choice of the optimum transistor working regime as temperature sensor. For instance, the transistor may be operated in sub-threshold, linear or saturation regions.

Figure 4:
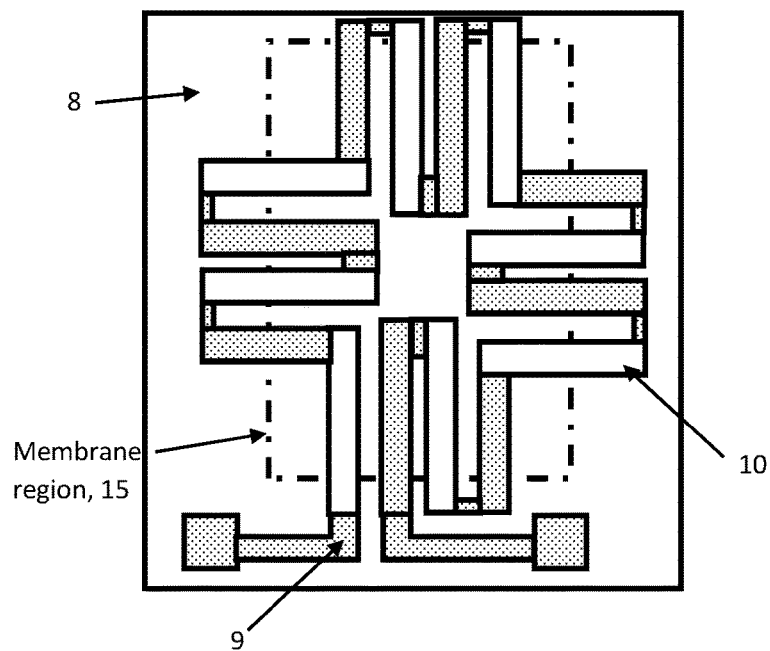
FIG. 4 shows a top view of a heterostructure-based infra-red device that can be operated as IR detector. The temperature sensing element of the IR detector is in form of a thermopile.

FIG. 4 shows a schematic top view of a heterostructure-based infra-red device, wherein the AlGaN/GaN element 10 comprising a 2DEG is configured to operate as a temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect.

Figure 5:
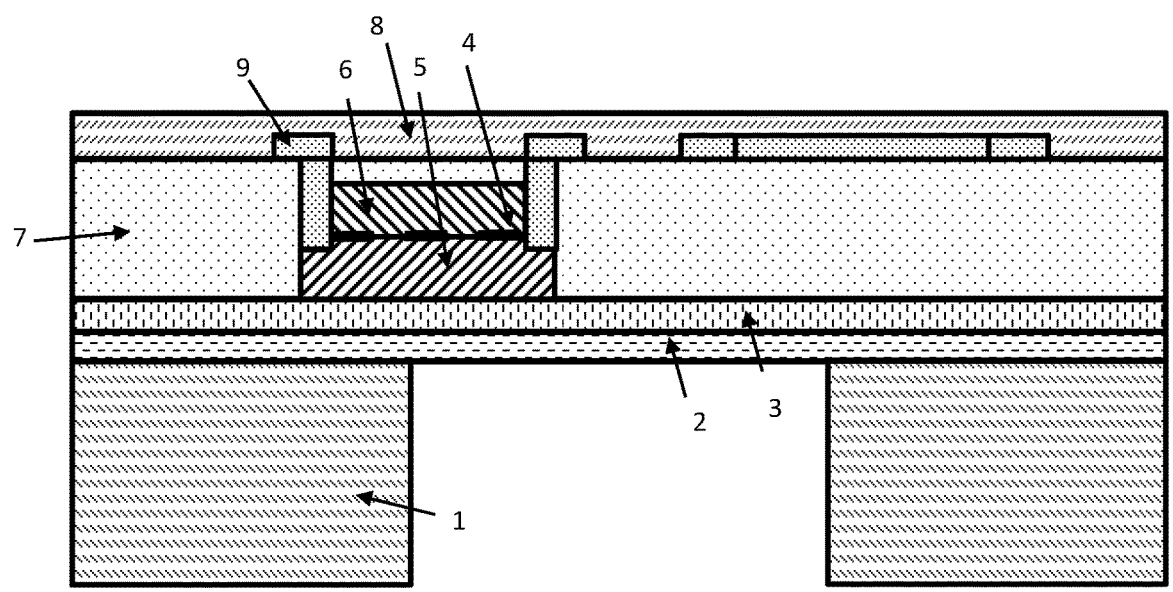
FIG. 5 shows a cross section of a heterostructure-based infra-red device that can be operated as IR detector. The temperature sensing element of the IR detector is in form of a thermopile.

FIG. 5 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The heterostructure based infra-red device is configured to operate as a temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example a first arm of a thermocouple is formed by the heterostructure and the second arm of a thermocouple is formed by a metal (the same metal used for the electrical connections). However many other options are possible in term of materials forming the second thermocouple arm (e.g. any one of the semiconductors forming the heterostructure, any of the semiconductors forming the heterostructures with a different doping, any other metals available in the process, etc.).

Figure 6:
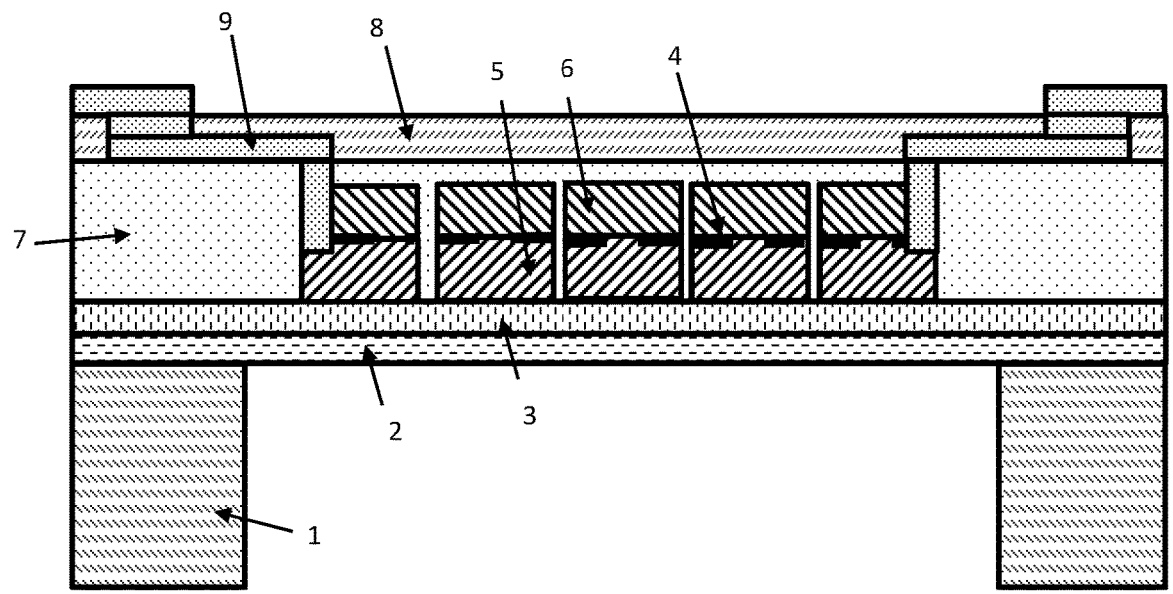
FIG. 6 shows a cross section of a heterostructure-based infra-red device that can be operated as IR emitter and/or as IR detector. The heating element and/or the temperature sensing element is patterned to form a plasmonic structure.

FIG. 6 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. The heterostructure based infra-red device is configured to tailor the optical properties of the IR device. In this specific example, the optical properties of the IR device are engineered by introducing period structures exploiting plasmonic resonances to modify the native overall optical properties of a multilayer structure. For simplicity, the AlGaN/GaN element formed within the membrane region, comprising a 2DEG, and configured to tailor the optical properties of the IR device will be referred to as a plasmonic element hereafter. The plasmonic element is formed by patterning the heterostructure. The pattern geometry defines the optical properties of the IR device.

Figure 7:
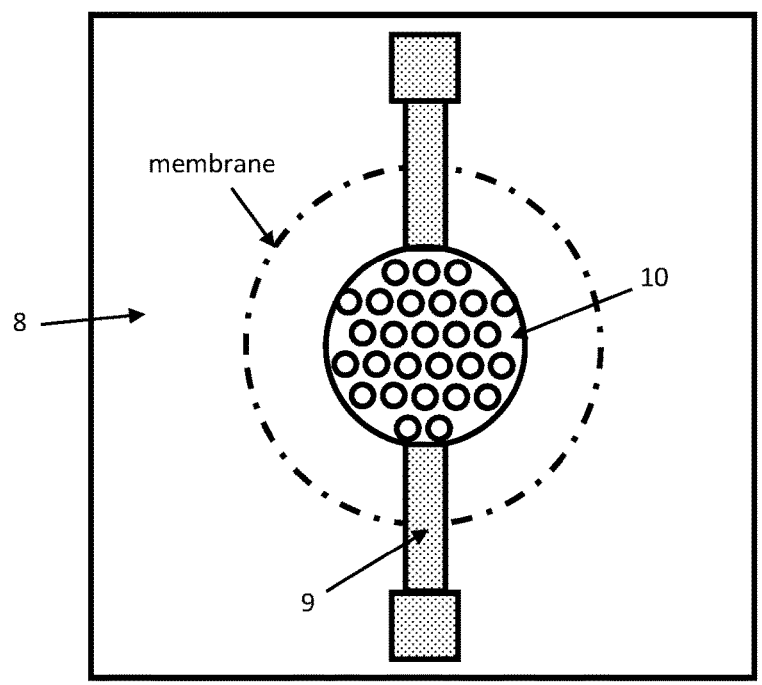
FIG. 7 shows a top view of a heterostructure-based infra-red device that can be operated as IR emitter and/or as IR detector. The heating element and/or the temperature sensing element is patterned to form a plasmonic structure.

FIG. 7 is a schematic top view of a heterostructure-based infra-red device, wherein the AlGaN/GaN element 10 formed within the membrane region and comprising a patterned 2DEG is configured to tailor the optical properties of the IR device. Also, the AlGaN/GaN element 10 may be operated as a heating element. The current flow within the 2DEG resistive heating element results in Joule heating, and generates IR radiation with a tailored IR spectrum. Alternatively, the AlGaN/GaN element 10 formed within the membrane region and comprising a 2DEG may be configured to operate as a resistive temperature sensing element. Only specific wavelengths (the ones for which the device has been tailored to be sensitive to) of the IR radiation coming onto the device surface generates an increase in the membrane temperature sensed by the resistive temperature sensing element. In this specific example the element 10 is chosen to be circular, but its shape could be any desired by the specific application (e.g. multi ring, spiral, meander, etc.), and etched in order to achieve a pattern with hexagonal symmetry, but its symmetry could be any desired by the specific application (e.g. square, etc.). The pattern is formed by circles etched in the heterostructure, but their shape could be any desired by the specific application (e.g. triangular, square, hexagonal, etc.).

Figure 8:
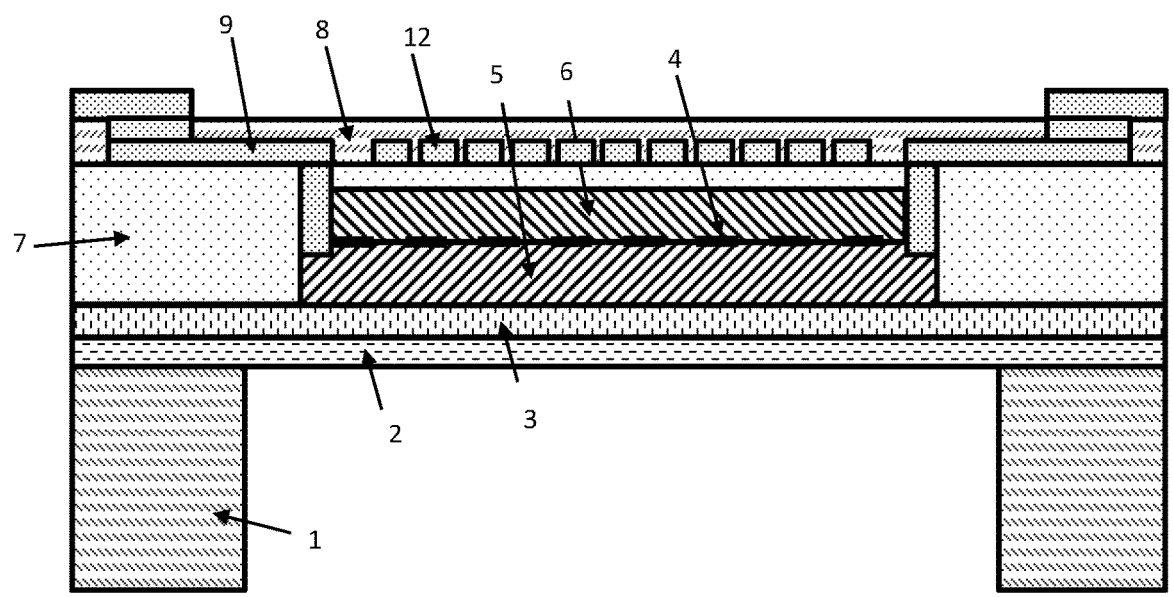
FIG. 8 shows a cross section of a heterostructure-based infra-red device that can be operated as IR emitter and/or as IR detector. The heating element and/or the temperature sensing element is below a plasmonic structure made of metal.

FIG. 8 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a plasmonic pattern 12, formed by patterning the layer otherwise used for the electrical interconnections. The pattern geometry defines the optical properties of the IR device. The heterostructure based infra-red device is configured to tailor the optical properties of the IR device. In this specific example, the optical properties of the IR device are engineered by introducing period metallic structures exploiting plasmonic resonances to modify the native overall optical properties of a multilayer structure.

Figure 9:
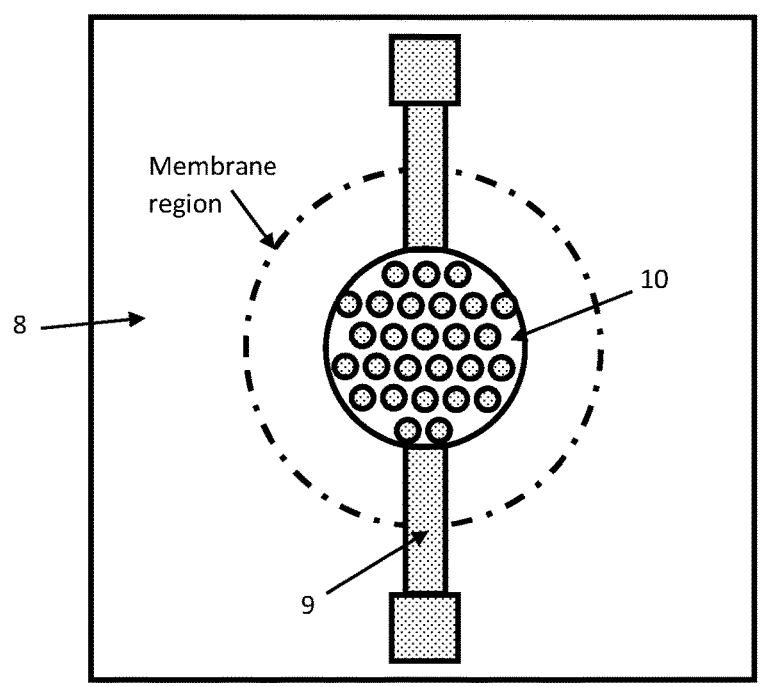
FIG. 9 shows a top view of a heterostructure-based infra-red device that can be operated as IR emitter and/or as IR detector. The heating element and/or the temperature sensing element is below a plasmonic structure made of metal.

FIG. 9 is a schematic top view of a heterostructure-based infra-red device, wherein the AlGaN/GaN element 10 formed within the membrane region and comprising a patterned metal layer is configured to tailor the optical properties of the IR device. Also, the AlGaN/GaN element 10 may be operated as a heating element. The current flow within the 2DEG resistive heating element results in Joule heating, and generates IR radiation with a tailored IR spectrum. Alternatively, the AlGaN/GaN element 10 formed within the membrane region and comprising a 2DEG may be configured to operate as resistive temperature sensing element. Only specific wavelengths (the ones for which the device has been tailored to be sensitive to) of the IR radiation coming onto the device surface generates an increase in the membrane temperature sensed by the resistive temperature sensing element. In this specific example the element 10 is chosen to be circular, but its shape could be any desired by the specific application (e.g. multi ring, spiral, meander, etc.). The metallic pattern has hexagonal symmetry, but its symmetry could be any desired by the specific application (e.g. square, etc.). The pattern is formed by metallic circles, but their shape could be any desired by the specific application (e.g. triangular, square, hexagonal, etc.).

Figure 10:
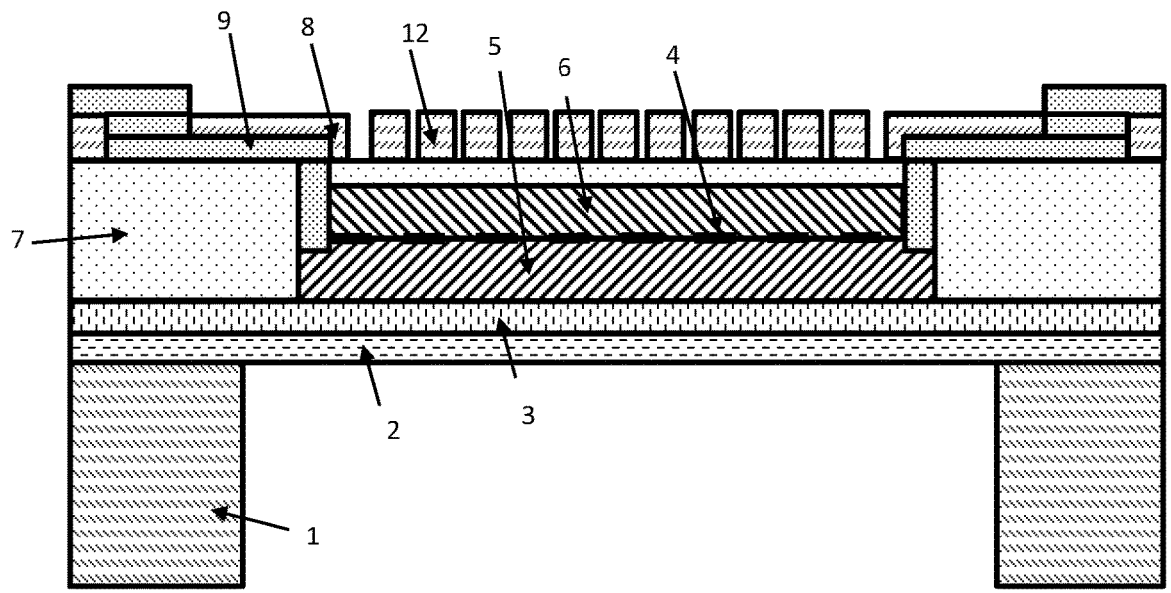
FIG. 10 shows a cross section of a heterostructure-based infra-red device that can be operated as IR emitter and/or as IR detector. The heating element and/or the temperature sensing element is below a plasmonic structure etched in the passivation layer.

FIG. 10 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a plasmonic pattern 12, formed by patterning the passivation layer 8. The pattern geometry defines the optical properties of the IR device. The heterostructure based infra-red device is configured to tailor the optical properties of the IR device. In this specific example, the optical properties of the IR device are engineered by introducing periodic dielectric structures exploiting plasmonic resonances to modify the native overall optical properties of a multilayer structure.

Figure 11:
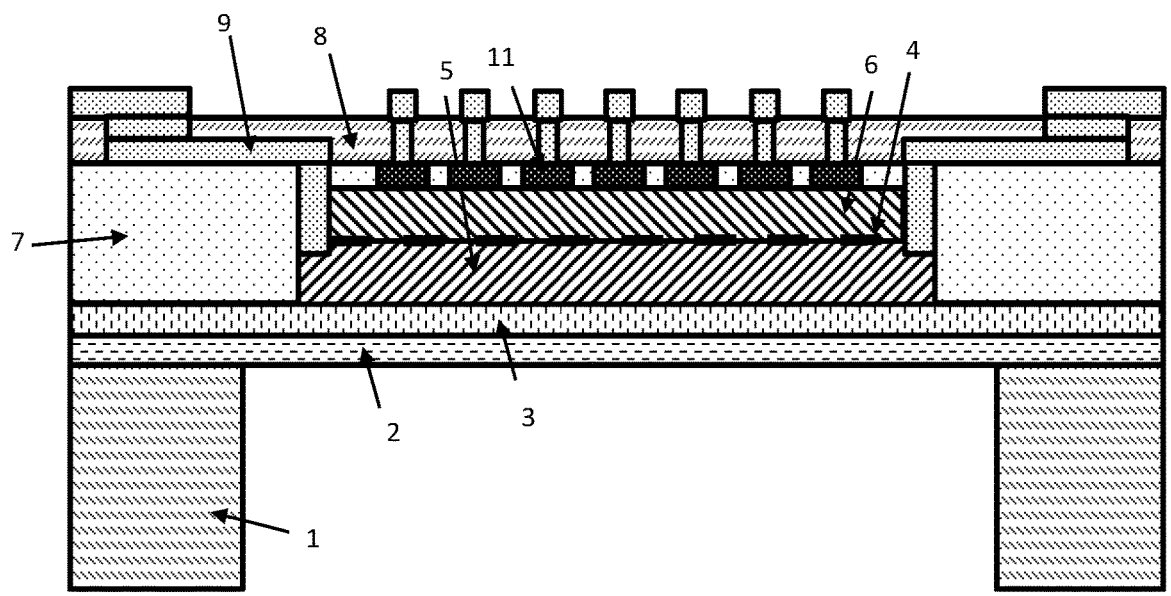
FIG. 11 shows a cross section of a heterostructure-based infra-red device that can be operated as IR emitter and/or as IR detector. The heating element and/or the temperature sensing element is in form of an HEMT with a patterned gate.

FIG. 11 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore, the device comprises a patterned gate 11. The pattern geometry defines the optical properties of the IR device. The heterostructure based infra-red device is configured to tailor and electrically tune the optical properties of the IR device. In this specific example, the optical properties of the IR device are engineered by introducing periodic gate structures exploiting plasmonic resonances to modify the native overall optical properties of a multilayer structure. The patterned gate 11, maybe used to modulate the carrier concentration and electrically tune the optical properties of the IR device. The AlGaN/GaN-based IR device may be configured to operate as tunable IR emitter, wherein the AlGaN/GaN element formed within the membrane region and comprising a 2DEG is a transistor (e.g. HEMT), and is configured to operate as a heating element. The current flow within the 2DEG results in Joule heating, and generates tailored and electrically tunable IR radiation. The use of the gate will allow direct electrical tenability of the Ir device tailored spectral properties. Alternatively the AlGaN/GaN-based IR device may be configured to operate as IR detector with tailored and electrically tunable optical properties, wherein the AlGaN/GaN element formed within the membrane region and comprising a 2DEG is a transistor (e.g. HEMT), and is configured to operate as temperature sensing element. Only specific wavelengths (the ones for which the device has been tailored and/or electrically tuned to be sensitive to) of the IR radiation coming onto the device surface generates an increase in the membrane temperature sensed by the temperature sensing transistor. The presence of the gate 11 will also enable the choice of the optimum transistor working regime as temperature sensor. For instance, the transistor may be operated in sub-threshold, linear or saturation regions.

Figure 12:
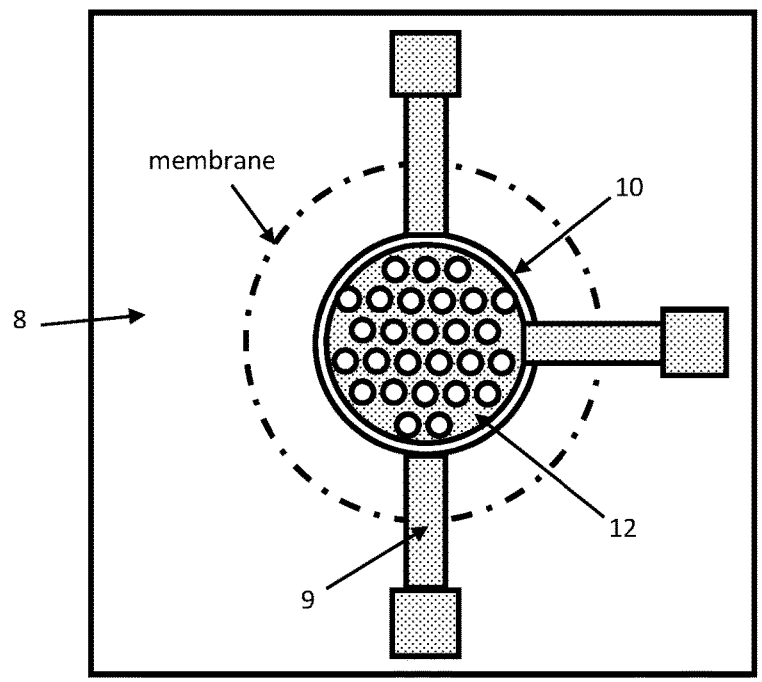
FIG. 12 shows a top view of a heterostructure-based infra-red device that can be operated as IR emitter and/or as IR detector. The heating element and/or the temperature sensing element is in form of an HEMT with a patterned gate.

FIG. 12 is a schematic top view of a heterostructure-based infra-red device, wherein the AlGaN/GaN element 10 formed within the membrane region and comprising a patterned gate is configured to tailor and electrically tune the optical properties of the IR device. Also, the AlGaN/GaN element 10 may be operated as a heating element. The current flow within the 2DEG resistive heating element results in Joule heating, and generates IR radiation with a tailored and electrically tunable IR spectrum. Alternatively, the AlGaN/GaN element 10 formed within the membrane region and comprising a 2DEG may be configured to operate as temperature sensing element. Only specific wavelengths (the ones for which the device has been tailored and electrically tuned to be sensitive to) of the IR radiation coming onto the device surface generates an increase in the membrane temperature sensed by the temperature sensing element. In this specific example the element 10 is chosen to be circular, but its shape could be any desired by the specific application (e.g. multi ring, spiral, meander, etc.). The gate pattern has hexagonal symmetry, but its symmetry could be any desired by the specific application (e.g. square, etc.). The pattern is formed by etched circles, but their shape could be any desired by the specific application (e.g. triangular, square, hexagonal, etc.).

FIG. 13 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; heterostructure-based elements formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based elements; a passivation layer 8; and electrical connections 9. A first heterostructure based infra-red device is configured to operate as temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example a first arm of a thermocouple is formed by the heterostructure and the second arm (not shown in the drawing) of a thermocouple is formed by a metal (the same metal used for the electrical connections). However many other options are possible in term of materials forming the second thermocouple arm (e.g. any one of the semiconductors forming the heterostructure, any of the semiconductors forming the heterostructures with a different doping, any other metals available in the process, etc.). A second heterostructure based infra-red device is configured to tailor and electrically tune the optical properties of the IR device. In this specific example, the optical properties of the IR device are engineered by introducing periodic gate structures exploiting plasmonic resonances to modify the native overall optical properties of a multilayer structure. The patterned gate 11, maybe used to modulate the carrier concentration and electrically tune the optical properties of the IR device.

FIG. 14 is a schematic top view of a heterostructure-based infra-red device, wherein a first AlGaN/GaN element 10a formed within the membrane region and comprising a patterned gate is configured to tailor and electrically tune the optical properties of the IR device. A second AlGaN/GaN element 10b formed within the membrane region and comprising a 2DEG may be configured to operate as temperature sensing element. Only specific wavelengths (the ones for which the first element 10a has been tailored and electrically tuned to be sensitive to) of the IR radiation coming onto the device surface generates an increase in the membrane temperature sensed by the temperature sensing element 10b. In this specific example the element 10a is chosen to be circular, but its shape could be any desired by the specific application (e.g. multi ring, spiral, meander, etc.). The gate pattern has hexagonal symmetry, but its symmetry could be any desired by the specific application (e.g. square, etc.). The pattern is formed by etched circles, but their shape could be any desired by the specific application (e.g. triangular, square, hexagonal, etc.). The second AlGaN/GaN element 10b is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect.

FIG. 15 shows a cross section of the heterostructure based IR device described in FIG. 11 3D stack on a second IR device. The second IR device may be any of the devices previously disclosed or any other IR device, even realised in a different technology (in this specific example a MEMS IR device), in order to provide the second IR device with optical properties different from its native ones. The stacking process may take place at wafer level and may allow the creation of a cavity at low pressure (lower than ambient pressure), in order to reduce thermal dissipation and thus improve the second IR device performance.

FIG. 16 shows a schematic top view of a 2×2 array of heterostructure based IR devices described in FIG. 4, wherein each AlGaN/GaN element 10 comprising a 2DEG is configured to operate as temperature sensing element. IR radiation coming onto the device surface generates an increase in the membrane temperature sensed by the temperature sensing element. The temperature sensing element is in form of a thermopile; wherein the thermopile is formed by a plurality of thermocouples; wherein each thermocouple is formed by two arms (or legs) joint together to form a hot junction located within the membrane and a cold junction located outside the membrane area; wherein the hot and cold junction are formed by using metal links to join the two dissimilar materials forming each thermocouple leg and thus avoid the formation of rectifying junctions. The voltage built across the thermopile terminals upon IR illumination is used as IR detection mechanism. This mechanism is usually referred to as Seebeck effect. In this specific example an array of thermopile is presented, but any combination in form of array of the previously disclosed devices is possible.

FIG. 17 shows a cross-section of a heterostructure-based infra-red device, comprising: a substrate 1 comprising an etched portion; a nucleation layer 2 and a transition layer 3 grown on the substrate 1, wherein the nucleation layer 2 and the transition layer 3 comprise a membrane over an area of the etched portion of the substrate; a heterostructure-based element formed within the membrane region where a two dimensional carrier gas (dashed line) is formed at the heterointerface 4 between semiconductor layers 5 (e.g. GaN) and 6 (e.g. AlGaN) of dissimilar bandgap. The infra-red device further comprises: a dielectric layer 7, used to electrically and thermally isolate the heterostructure-based element; a passivation layer 8; and electrical connections 9. Furthermore the device comprises an emission/absorption coating 13. The AlGaN/GaN-based IR device may be configured to operate as IR emitter, wherein the AlGaN/GaN element formed within the membrane region and comprising a 2DEG is configured to operate as a heating element. The current flow within the 2DEG resistive heating element results in Joule heating, and generates IR radiation. Alternatively the AlGaN/GaN-based IR device may be configured to operate as IR detector, wherein the AlGaN/GaN element formed within the membrane region and comprising a 2DEG is configured to operate as resistive temperature sensing element. IR radiation coming onto the device surface generates an increase in the membrane temperature sensed by the resistive temperature sensing element.

FIG. 18 shows a cross-section of the heterostructure-based infra-red device described in FIG. 11. Furthermore the device also comprises on chip circuitry, in the drawing in form of a HEMT off-membrane. The circuitry may also be on-membrane. If silicon is used as starting substrate CMOS circuitry may also be integrated in substrate 1.

LIST OF REFERENCE NUMERALS 1 substrate
2 Nucleation region
3 Transition region
4 heterointerface
5 GaN
6 AlGaN
7 Dielectric layer
8 Passivation layer
9 Electrical connections
10 AlGaN/GaN element
11 gate
12 plasmonic layer
13 Absorption/emission coating
15 membrane region Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A heterostructure-based infra-red (IR) device comprising:
a substrate comprising an etched portion and a substrate portion;
a device region located on the etched portion and the substrate portion, the device region comprising a membrane region which is an area over the etched portion of the substrate;
at least one heterostructure-based element located at least partially within or on the membrane region, the heterostructure-based element comprising at least one two dimensional carrier gas, a first III-nitride semiconductor layer having a first band gap, and a second III-nitride semiconductor layer having a second bandgap different from the first band gap disposed on the first III-nitride semiconductor layer, wherein the two dimensional carrier gas is formed between the first and second III-nitride semiconductor layers; and
wherein the IR device is configured to operate as either an IR emitter or an IR detector.

2. An IR device according to claim 1, wherein the first III-nitride semiconductor layer comprises any one of gallium nitride (GaN), aluminium gallium nitride (AlGaN) and indium aluminium gallium nitride (InAlGaN); and wherein the second III-nitride semiconductor layer comprises any one of gallium nitride (GaN), aluminium gallium nitride (AlGaN) and indium aluminium gallium nitride (InAlGaN); and wherein the at least one two dimensional carrier gas is two dimensional electron gas (2DEG) or two dimensional hole gas (2DHG).

3. An IR device according to claim 1, wherein the IR device is an IR emitter.

4. An IR device according to claim 3, wherein the two dimensional carrier gas is configured to operate as a heating element which is any one of a self-heated resistor, a self-heated diode; a self-heated transistor, and a self-heated transistor in diode configuration.

5. An IR device according to claim 4, wherein the self-heated transistor is a high electron mobility transistor configured to control direct temperature modulation without using an external transistor.

6. An IR device according to claim 1, wherein the IR device is an IR detector.

7. An IR device according to claim 6, wherein the IR device comprises a temperature sensing element comprising the two dimensional carrier gas.

8. An IR device according to claim 7, wherein the temperature sensing element comprises any one of a resistor, a transistor, a diode and a transistor in a diode configuration.

9. An IR device according to claim 7, wherein the temperature sensing element comprises a thermopile, wherein the thermopile comprises a plurality of thermocouples, wherein each thermocouple comprises two arms coupled together to form a hot junction located within the membrane region and a cold junction located outside the membrane region.

10. An IR device according to claim 1, wherein the heterostructure-based element comprises laterally spaced structures configured to operate as plasmonic structures.

11. An IR device according to claim 1, further comprising laterally spaced structures over the heterostructure-based element, or above or below the membrane region.

12. An IR device according to claim 10, wherein the plasmonic structures are configured to modify optical properties of the IR device.

13. An IR device according to claim 10, wherein the two dimensional carrier gas is configured to electrically tune optical properties by modulating the two dimensional carrier gas concentration in proximity of a plasmonic structure.

14. An IR device according to claim 1, further comprising a coating made of any of silicon oxide, silicon nitride, polymers, carbon black, carbon nanotubes, metal oxides, black gold, black platinum or graphene or combination of such materials or a porous or high surface to volume ratio layer or nanostructured layer located above or below the membrane region to enhance absorption and/or emissions.

15. An IR device according to claim 1, further comprising a plurality of heterostructure-based elements each having two dimensional carrier gas.

16. An IR device according to claim 1, comprising a further IR device located on top of or below the IR device to form a three dimensional stack.

17. An IR device according to claim 1, further comprising integrated circuitry on the same chip as the IR device, wherein the integrated circuitry is formed within the substrate of the IR device, or within an hetero-structure.

18. An IR array device comprising an array of a plurality of IR devices according to claim 1.

19. A method of manufacturing a heterostructure-based IR device, the method comprising:
    forming a substrate comprising an etched portion and a substrate portion;
    forming a device region on the etched portion and the substrate portion, the device region comprising a membrane region which is an area over the etched portion of the substrate; and
    forming at least one heterostructure-based element at least partially within or on the membrane region, wherein the heterostructure-based element comprises at least one two dimensional carrier gas, a first III-nitride semiconductor layer having a first band gap, and a second III-nitride semiconductor layer having a second bandgap different from the first band gap disposed on the first III-nitride semiconductor layer, wherein the two dimensional carrier gas is formed between the first and second III-nitride semiconductor layers; and
    wherein the IR device operates as either an IR emitter or an IR detector.

* * * * *